United States Patent
Mozak et al.

(10) Patent No.: US 9,934,842 B2
(45) Date of Patent: Apr. 3, 2018

(54) MULTIPLE RANK HIGH BANDWIDTH MEMORY

(71) Applicant: Intel Corporation, Santa Clara, CA (US)

(72) Inventors: Christopher P. Mozak, Beaverton, OR (US); Randy B. Osborne, Beaverton, OR (US); Michael Gutzmann, Forest Grove, OR (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/351,195

(22) Filed: Nov. 14, 2016

(65) Prior Publication Data

US 2017/0140809 A1    May 18, 2017

Related U.S. Application Data

(60) Provisional application No. 62/254,642, filed on Nov. 12, 2015.

(51) Int. Cl.
    *G11C 8/00*      (2006.01)
    *G11C 11/4093*      (2006.01)
    *G11C 11/4076*      (2006.01)
    *G11C 11/4096*      (2006.01)

(52) U.S. Cl.
    CPC ...... *G11C 11/4093* (2013.01); *G11C 11/4076* (2013.01); *G11C 11/4096* (2013.01)

(58) Field of Classification Search
    CPC ... G11C 8/00; G11C 11/4093; G11C 11/4076; G11C 11/4096
    USPC ............... 365/230.01–243, 189.011–225.7
    See application file for complete search history.

(56) References Cited

U.S. PATENT DOCUMENTS 5,375,208 A * 12/1994 Pitot ............... G06F 5/065
                                            711/156

* cited by examiner

*Primary Examiner* — Harry W Byrne
(74) *Attorney, Agent, or Firm* — Alpine Technology Law Group LLC

(57) ABSTRACT

Methods and apparatus related to multiple rank high bandwidth memory are described. In one embodiment, a semiconductor package includes a high bandwidth memory with multiple ranks. Other embodiments are also disclosed and claimed.

16 Claims, 5 Drawing Sheets

MULTIPLE RANK HIGH BANDWIDTH MEMORY

FIELD

The present disclosure generally relates to the field of electronics. More particularly, some embodiments generally relate to multiple rank High Bandwidth Memory (HBM).

BACKGROUND

Generally, memory used to store data in a computing system can be volatile (to store volatile information) or non-volatile (to store persistent information). Volatile data structures stored in volatile memory are generally used for temporary or intermediate information that is required to support the functionality of a program during the run-time of the program. On the other hand, persistent data structures stored in non-volatile (or persistent memory) are available beyond the run-time of a program and can be reused.

As computing capabilities are enhanced in processors, one concern is the speed at which memory may be accessed by a processor. For example, to process data, a processor may need to first fetch data from a memory. After completion of the data processing, the results may need to be stored in the memory. Therefore, the memory access speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices (such as computer servers, e.g., used in a data center, etc.) as excess power consumption may increase costs (e.g., due to additional power usage, increased cooling requirements, etc.), shorten component life, limit locations at which a device may be used, etc.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
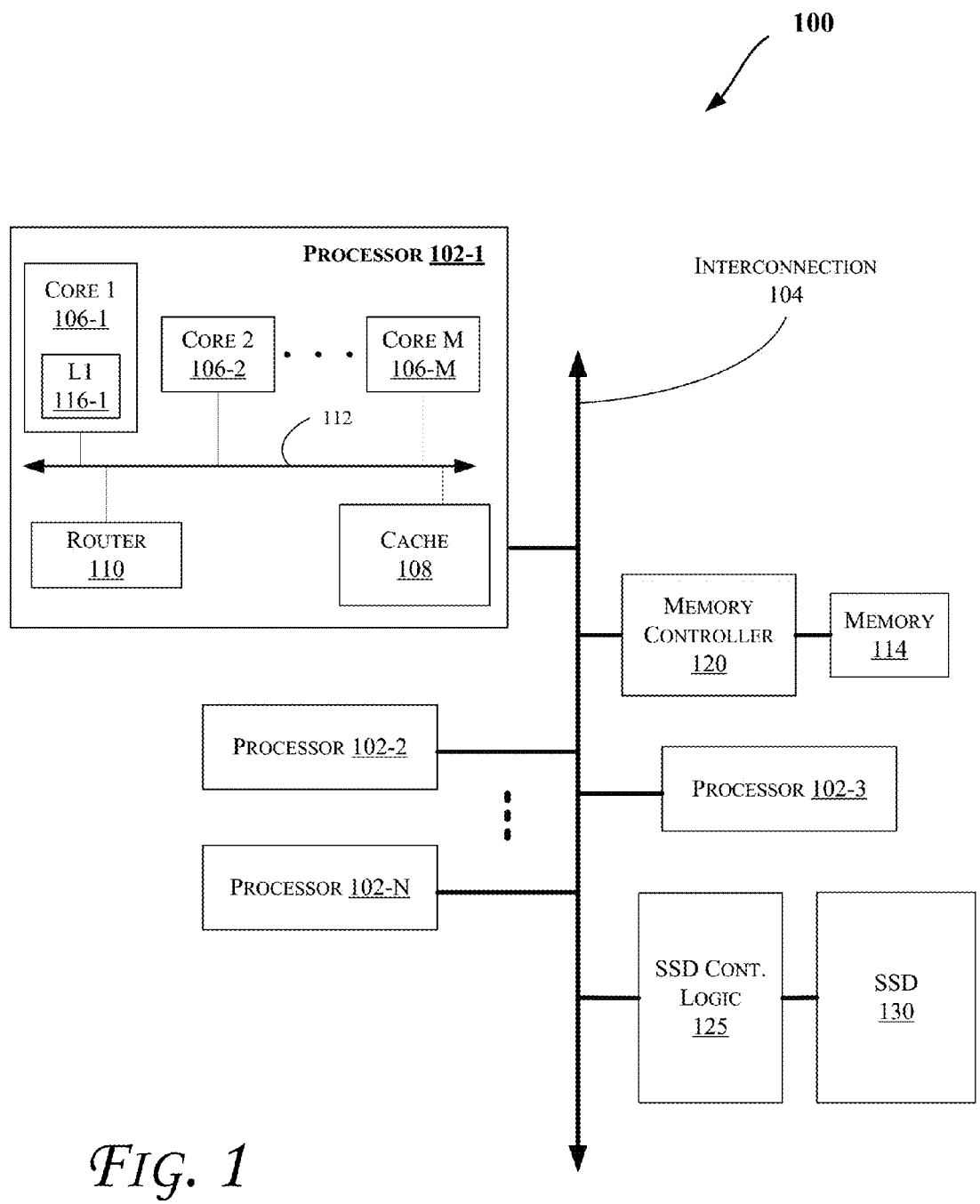
FIGS. 1 and 3-5 illustrate block diagrams of embodiments of computing systems, which may be utilized to implement various embodiments discussed herein.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

Some embodiments relate to multiple rank High Bandwidth Memory (or HBM). Generally, High Bandwidth Memory (HBM) provides very high memory bandwidth (e.g., about 250 GB/s (Giga Bytes per second). Also, HBM may be integrated on package, e.g., on a semiconductor package with other components such as one or more processor cores, logic, DRAM (Dynamic Random Access Memory), etc. Moreover, HBM is an in-package memory technology that uses a relatively very wide data and command bus to communicate with DRAM memory through silicon interposer, silicon bridge, through silicon vias, organic package, or other dense routing technologies. However, it currently may come in only one form factor (e.g., with 8 channel×128 bits wide data bus with a memory or DRAM (Dynamic Random Access Memory) size of 8 mm (millimeter) by 12 mm and a physical IO area size of 2 mm×6 mm). As discussed herein, the HBM may include any type of volatile memory (e.g., random access memory), etc. This limits HBM applications in certain areas where physical size and/or form factor constraints are paramount. In particular, the current HBM memory cannot fit within some existing sockets using the current package design rules. If it can be made to fit, HBM memory would provide a very interesting option to improve general computing and/or graphics power and/or performance for various computing systems such as high end systems. It may also enable critical display usage models.

In accordance with at least one embodiment, one way to make HBM memory more flexible is to enable a multiple rank solution. Today, HBM is generally defined in the JEDEC standard (e.g., in accordance with committee letter ballot, committee JC-42.3C, committee item number 1797.99F, subject: Proposed HBMW DRAM Specification Update, Rev. 1.42, Aug. 25, 2015) as having 8 channels, where each channel is a single rank. JEDEC Solid State Technology Association, formerly known as the Joint Electron Device Engineering Council (JEDEC), is an independent semiconductor engineering trade organization and standardization body. More particularly, one embodiment allows HBM to be converted into a four channel by two rank, where each channel remains 128 DQ (or Data In or Out) line/pin wide. This can in turn reduce HBM SOC (System On Chip) silicon area and/or package wire count two-fold, e.g., at a cost of two-fold bandwidth reduction. As discussed herein, a memory "rank" generally refers to a plurality of DRAM integrated circuit chips that are coupled to the same chip select pin (where the CS or chip select pin selects which chip is to be coupled for communication or data input/output). As a result the plurality of DRAM chips may be accessed simultaneously. The plurality of DRAM chips may also share all the command and/or control signals. Only the data pins may be separate for each DRAM chip (but the data pins may be shared across ranks). Furthermore, all commands, control, and data signals are generally shared across the chips and only a unique CS needs to be used to select a given rank.

The techniques discussed herein may be provided in various computing systems (e.g., including a non-mobile computing device such as a desktop, workstation, server, rack system, etc. and a mobile computing device such as a smartphone, tablet, UMPC (Ultra-Mobile Personal Computer), laptop computer, Ultrabook™ computing device, smart watch, smart glasses, smart bracelet, etc.), including those discussed with reference to FIGS. 1-5. More particularly, FIG. 1 illustrates a block diagram of a computing system 100, according to an embodiment. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a processor cache 108 (which may be a shared cache or a private cache in various embodiments), and/or a router 110. The processor cores 106 may be implemented on a single integrated circuit (IC) chip. Moreover, the chip may include one or more shared and/or private caches (such as processor cache 108), buses or interconnections (such as a bus or interconnection 112), logic 120, memory controllers (such as those discussed with reference to FIGS. 3-5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The processor cache 108 may store data (e.g., including instructions) that are utilized by one or more components of the processor 102-1, such as the cores 106. For example, the processor cache 108 may locally cache data stored in a memory 114 for faster access by the components of the processor 102. As shown in FIG. 1, the memory 114 may be in communication with the processors 102 via the interconnection 104. In an embodiment, the processor cache 108 (that may be shared) may have various levels, for example, the processor cache 108 may be a mid-level cache and/or a last-level cache (LLC). Also, each of the cores 106 may include a level 1 (L1) processor cache (116-1) (generally referred to herein as "L1 processor cache 116"). Various components of the processor 102-1 may communicate with the processor cache 108 directly, through a bus (e.g., the bus 112), and/or a memory controller or hub.

As shown in FIG. 1, memory 114 may be coupled to other components of system 100 through a memory controller 120. Memory 114 includes volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

System 100 also includes Non-Volatile (NV) storage (or Non-Volatile Memory (NVM), e.g., NVMe) device such as an Solid State Drive (SSD) 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 1, logic 125 may communicate via a storage bus/interconnect (such as the SATA (Serial Advanced Technology Attachment) bus, Peripheral Component Interconnect (PCI) (or PCI express (PCIe) interface), etc.) with one or more other components of system 100 (for example where the storage bus is coupled to interconnect 104 via some other logic like a bus bridge, chipset (such as discussed with reference to FIGS. 2 and 3-5), etc.). Additionally, logic 125 may be incorporated into memory controller logic (such as those discussed with reference to FIGS. 3-5) or provided on a same Integrated Circuit (IC) device in various embodiments (e.g., on the same IC device as the SSD 130 or in the same enclosure as the SSD 130). System 100 may also include other types of non-volatile storage such as those discussed with reference to FIGS. 3-5, including for example a hard drive, etc.

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein such as those discussed with reference to other figures including 3-5, for example), including the cores 106, interconnections 104 or 112, components outside of the processor 102, SSD 130, SSD bus, SATA bus, PCIe bus, logic 125, etc., to sense variations in various factors affecting power/thermal behavior of the system/platform, such as temperature, operating frequency, operating voltage, power consumption, and/or inter-core communication activity, etc.

As mentioned above, some embodiments allow products to trade bandwidth for (e.g., about 1 mm of) die/package real-estate savings. One major benefit is lower silicon area cost, which at the simplest level would be 6 mm². More specifically, the IO (Input/Output) area for HBM is roughly 6 mm×2 mm (per the JEDEC ball grid for HBM2 but this would change with other technologies). Such an approach cuts the IO area in half, saving 6 mm^2. However, in some products with multiple derivatives, adding HBM to an existing floorplan can create significant white/available space and this area may be multiplied by three-fold or more. The lower area may also enable HBM to fit within an existing package or system form factor where it cannot currently fit. Further, this approach could cut HBM wire count by roughly 50% and may enable HBM to use alternate package interconnect technology that would lower costs in the future.

Figure 2:
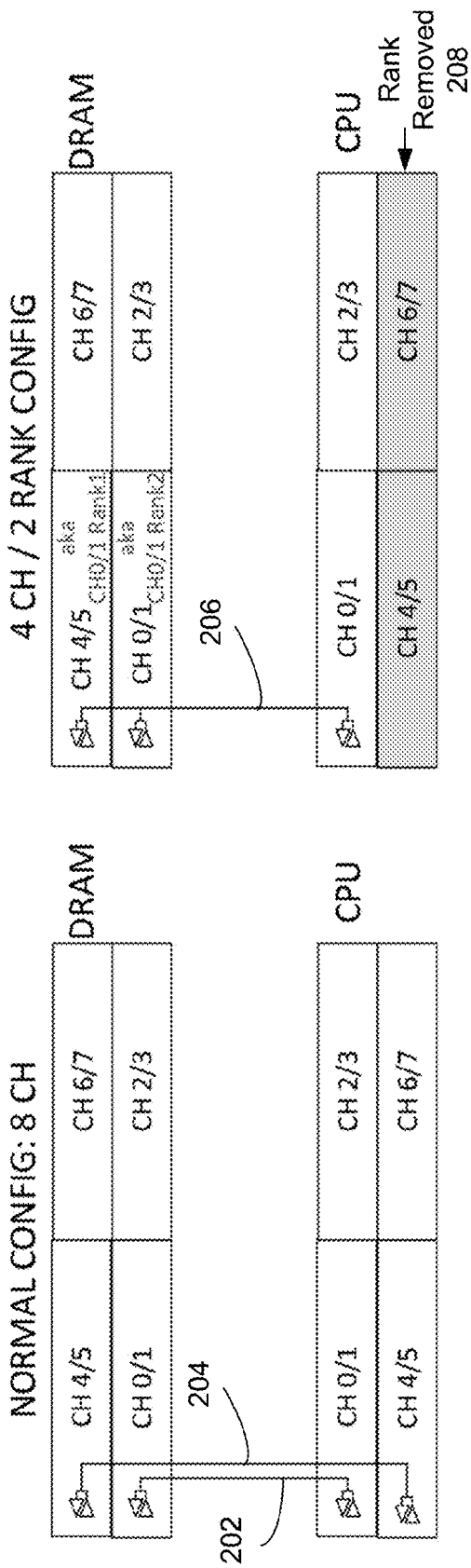
FIG. 2 illustrates a block diagram of a High Bandwidth Memory (HBM) implementation, according to an embodiment.

FIG. 2 illustrates a block diagram of a HBM implementation, according to an embodiment. Various components discussed herein with reference to FIGS. 1, 3, 4, and/or 5 may be used to implement the embodiment of FIG. 2 (including for example items 120/310/406/408 and/or 114/410/412). The normal HBM layout configuration (on the left side of FIG. 2) is a two row by two column array, where each block contains two interleave channels (e.g., 8 channels are labeled 0 through 7). With reference to FIG. 2, each "block" refers to the four boxes shown in each quadrant/corner of FIG. 2. This structure can be duplicated in both the DRAM and/or CPU (Central Processing Unit, also interchangeably referred to herein as "processor" having one or more processor cores), e.g., using one routing layer 202 to couple the inner channels (i.e., CH 0/1 and CH 2/3) and the one routing layer 204 to the outer channels (i.e., CH 4/5 and CH 6/7). Furthermore, the same DRAM device is used in both the left side and right side of FIG. 2, e.g., with no changes in design or programming. In accordance with one or more embodiments, the changes discussed herein occur in the SOC (System On Chip) or integrated circuit and wire connections (where "wire" may interchangeably be referred to herein as interconnect or bus) between the processor and the DRAM (or more generally the volatile memory). However, the change(s) are transparent to the DRAM.

As shown in FIG. 2, an embodiment keeps the DRAM unchanged and eliminates four channels from the CPU (right side of FIG. 2). This allows the system to continue to use the mainstream, lowest cost HBM memory, e.g., as opposed to some new, specialty HBM device. As illustrated, a single CPU channel or routing layer 206 couples to two DRAM channels, creating a two rank system, and rank 208 is removed. Hence, wire count is reduced by roughly half which may enable lower density and/or a lower cost interconnect. Further, as shown in FIG. 2, the DRAM called Ch0/1 will now be treated as Rank1 of Ch0/1, and the DRAM called Ch4/5 will now be treated as Rank2 of Ch01/2. In other words, the system is essentially shorting (or (e.g., logically) combining) Ch0/1 to Ch4/5 and treating these are two different ranks of the same channel.

To make this work, there are several corner cases with the individual signals that are addressed below. While some embodiments are discussed mostly with respect to the worst case assuming no DRAM or JEDEC support for multiple ranks, it is understood that there are multiple options available and adding some DRAM support could simplify such implementations. Furthermore, the description below points out some of these options but these options should be taken by way of example and not as limitation or restriction. In most cases, there may be several variations of ways to handle this by those with ordinary skill in the art.

(1) Clock (from CPU/processor): The clock may be shared across channels/ranks, e.g., across the two DRAM channels that form one CPU channel with two ranks.

(2) Col/Row Bus (wherein "C[ ]" refers to column bits and "R[ ]" refers to Row bits): Duplicate R[2:0] and C[2:0] such that only one rank receives the command and the non-target rank receives a NOP (no operation) command (instead of a valid command). In the current specification, bits [2:0] are the minimal signals used to encode a NOP. R[5:3] and C[7:3] can be shared, e.g., assuming address parity is not supported. If parity is not disabled, one or more row and column lanes may be duplicated. If a redundant row or column lane is supported (e.g., to allow a defective lane to be repaired by replacing it with the redundant lane), that redundant lane may be shared across one or more ranks as long as these ranks fuse/or configure the repair information the same way. If the DRAM can change, this could be simplified by adding one or two CS/CID (Chip Select/Channel Identifier) pins using the existing RFU (Reserved for Future Use) pins to qualify which rank is targeted by each command.

(3) CKE (Clock Enable): There would be no problem sharing across ranks but not having a CKE signal/pin may reduce power saving opportunities since ranks cannot be powered down independently. Adding an extra CKE signal/pin is optional and may pose a tradeoff between cost/pin count vs. low power.

(4) Data: No special support is provided given the existing bi-directional nature of DQ. For one embodiment, "Data" bit(s) includes DQ bit, DBI (Data Bus Inversion) bit, DM (Data Mask) bit, Parity bit, and/or one or more Redundant Data bits.

(5) Read Strobe: Per the current JEDEC specification, the read strobe signal has to be duplicated as each DRAM channel is always driving its strobe and it is never tri-stated. However, if the DRAM changed to support tri-state on read strobe, it may be possible to share this signal between both ranks. Moreover, in HBM, the controller may delay the read strobe to center it in the data eye. This delay may need to be different for each rank to obtain the highest frequency and/or performance from the system. This may also utilize additional logic to control when the delay control changes. The controller may include additional logic to select which rank's strobe is used to sample a data on the bus at a given time.

(6) Write Strobe: Can be shared between the two ranks without changes. Normally, write strobe signal is delayed by the controller compared to the write data, centering the strobe in the middle of the data eye. This delay may need to be different for each rank to obtain the highest frequency and/or performance from the system.

(7) Derr/Aerr (error signals transmitted by the memory): These optional signals can be shared if this feature is not supported (e.g., parity) or silicon can detect the case where one rank drives high and one rank drives low. To support one rank driving high and one rank driving low, the controller's receiver logic would need to adjust its trip/trigger point to be lower, e.g., closer to Vdd/4 instead of the standard Vdd/2 (where Vdd refers to the supply voltage provided to the DRAM chip). Some systems may even train the receiver's trip point for optimum performance. Other systems may just duplicate the signal(s) across the two ranks to enable a simple receiver logic implementation with no contention between ranks. Accordingly, the Derr/Aerr pins may be duplicated between ranks. If the DRAM can change, these pin(s) may be defined as open drain with a CPU pull-up. The open drain topology on the DRAM allows both ranks to share one pin.

In one embodiment, the processor is the bus master and transmits the commands. Moreover, the processor transmits a valid command to the target rank and a NOP to the non-target rank. The NOP may be implemented using either a ChipSelect/ChipID pin or providing an independent subset of the command bus to each rank. In some embodiments, the CPU may need per rank timing adjustment to enable full frequency across all ranks. This allows each rank to use a different phase delay setting to provide the best possible timing margin. For example, write data may use different timing when targeting rank 0 vs. rank 1. Similarly, C[2:0] may use different timing than C[7:3] given the different loading conditions.

Accordingly, in some current HBMs the only flexibility is in capacity (i.e., the number of DRAM in the stack). By contrast, some embodiments add another degree of freedom where HBM can adjust/tradeoff bandwidth vs. form factor as well. This in turn may enable HBM to fit within the existing products, e.g., using existing socket designs.

Figure 3:
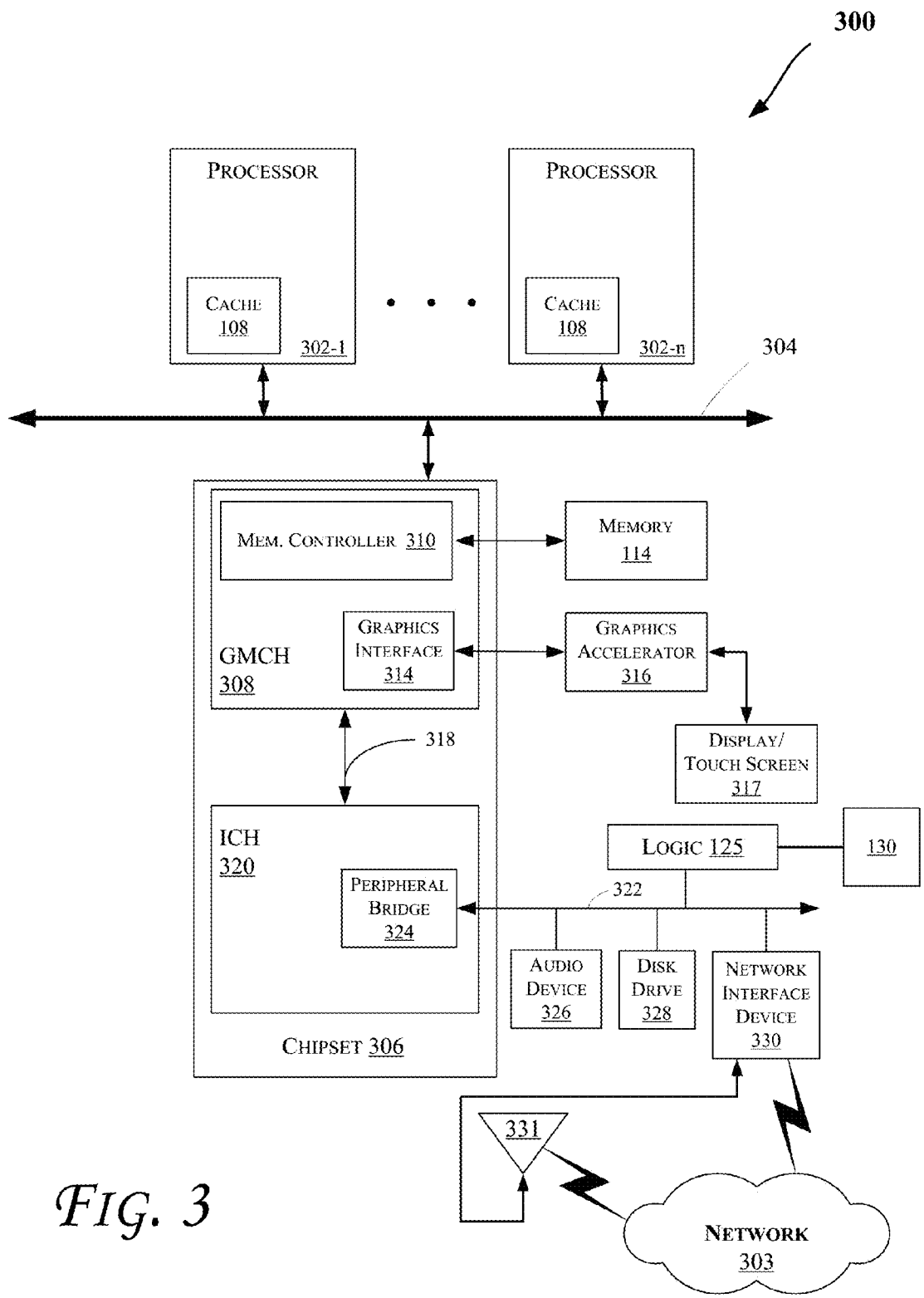

FIG. 3 illustrates a block diagram of a computing system 300 in accordance with an embodiment. The computing system 300 may include one or more central processing unit(s) (CPUs) 302 or processors that communicate via an interconnection network (or bus) 304. The processors 302 may include a general purpose processor, a network processor (that processes data communicated over a computer network 303), an application processor (such as those used in cell phones, smart phones, etc.), or other types of a processor (including a reduced instruction set computer (RISC) processor or a complex instruction set computer (CISC)). Various types of computer networks 303 may be utilized including wired (e.g., Ethernet, Gigabit, Fiber, etc.) or wireless networks (such as cellular, including 3G (Third- Generation Cell-Phone Technology or 3rd Generation Wireless Format (UWCC)), 4G, Low Power Embedded (LPE), etc.). Moreover, the processors 302 may have a single or multiple core design. The processors 302 with a multiple core design may integrate different types of processor cores on the same integrated circuit (IC) die. Also, the processors 302 with a multiple core design may be implemented as symmetrical or asymmetrical multiprocessors.

In an embodiment, one or more of the processors 302 may be the same or similar to the processors 102 of FIG. 1. For example, one or more of the processors 302 may include one or more of the cores 106 and/or processor cache 108. Also, the operations discussed with reference to FIGS. 1-2 may be performed by one or more components of the system 300.

A chipset 306 may also communicate with the interconnection network 304. The chipset 306 may include a graphics and memory control hub (GMCH) 308. The GMCH 308 may include a memory controller 310 (which may be the same or similar to the memory controller 120 of FIG. 1 in an embodiment) that communicates with the memory 114. The memory 114 may store data, including sequences of instructions that are executed by the CPU 302, or any other device included in the computing system 300. Also, system 300 includes logic 125, and/or SSD 130 (which may be coupled to system 300 via bus 322, via other interconnects such as 304, where logic 125 is incorporated into chipset 306, etc. in various embodiments). In one embodiment, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk drive, flash, etc., including any NVM discussed herein. Additional devices may communicate via the interconnection network 304, such as multiple CPUs and/or multiple system memories.

The GMCH 308 may also include a graphics interface 314 that communicates with a graphics accelerator 316. In one embodiment, the graphics interface 314 may communicate with the graphics accelerator 316 via an accelerated graphics port (AGP) or Peripheral Component Interconnect (PCI) (or PCI express (PCIe) interface). In an embodiment, a display 317 (such as a flat panel display, touch screen, etc.) may communicate with the graphics interface 314 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 317.

A hub interface 318 may allow the GMCH 308 and an input/output control hub (ICH) 320 to communicate. The ICH 320 may provide an interface to I/O devices that communicate with the computing system 300. The ICH 320 may communicate with a bus 322 through a peripheral bridge (or controller) 324, such as a peripheral component interconnect (PCI) bridge, a universal serial bus (USB) controller, or other types of peripheral bridges or controllers. The bridge 324 may provide a data path between the CPU 302 and peripheral devices. Other types of topologies may be utilized. Also, multiple buses may communicate with the ICH 320, e.g., through multiple bridges or controllers. Moreover, other peripherals in communication with the ICH 320 may include, in various embodiments, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 322 may communicate with an audio device 326, one or more disk drive(s) 328, and a network interface device 330 (which is in communication with the computer network 303, e.g., via a wired or wireless interface). As shown, the network interface device 330 may be coupled to an antenna 331 to wirelessly (e.g., via an Institute of Electrical and Electronics Engineers (IEEE) 802.11 interface (including IEEE 802.11a/b/g/n/ac, etc.), cellular interface, 3G, 4G, LPE, etc.) communicate with the network 303. Other devices may communicate via the bus 322. Also, various components (such as the network interface device 330) may communicate with the GMCH 308 in some embodiments. In addition, the processor 302 and the GMCH 308 may be combined to form a single chip. Furthermore, the graphics accelerator 316 may be included within the GMCH 308 in other embodiments.

Furthermore, the computing system 300 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 328), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 4:
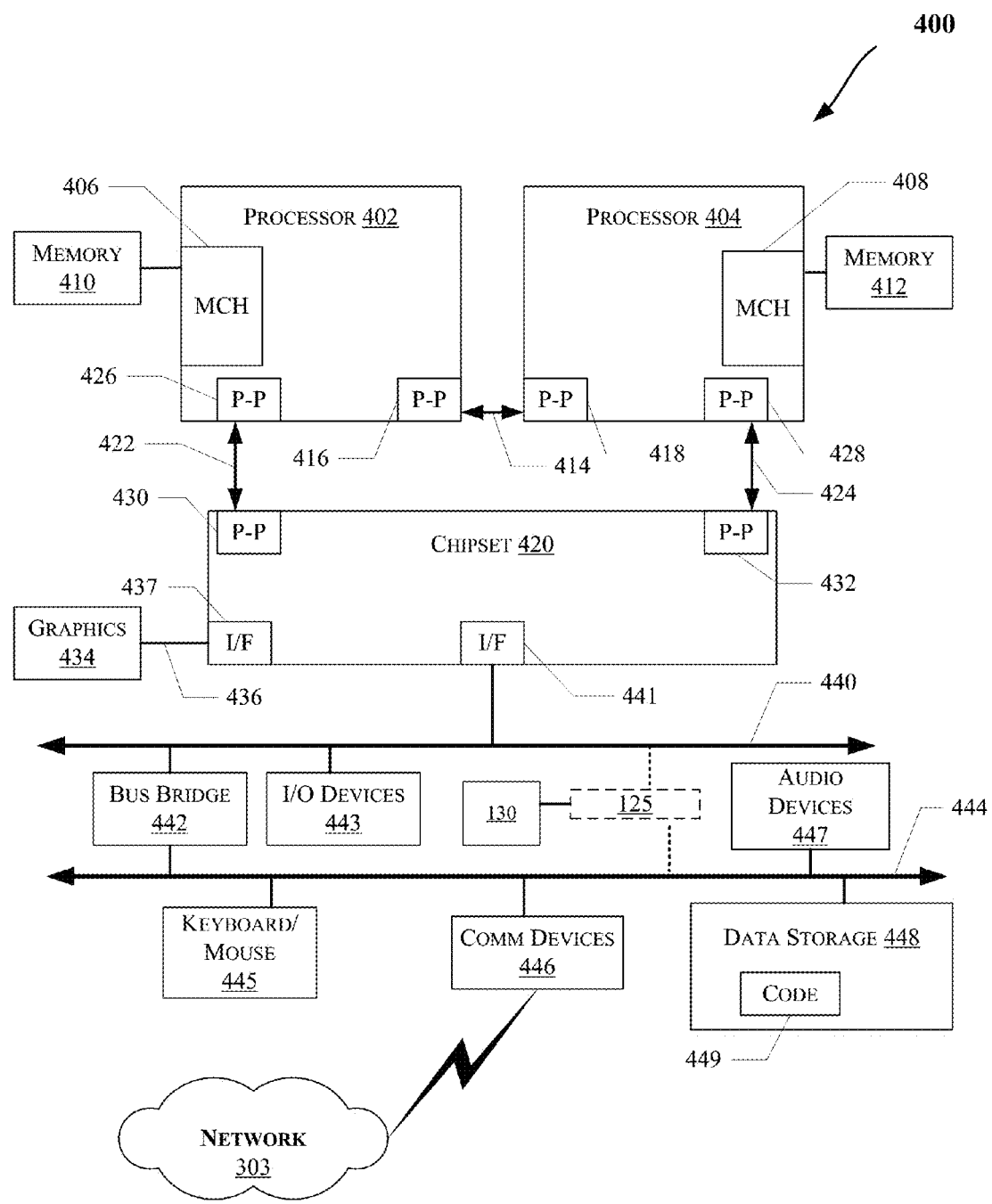

FIG. 4 illustrates a computing system 400 that is arranged in a point-to-point (PtP) configuration, according to an embodiment. In particular, FIG. 4 shows a system where processors, memory, and input/output devices are interconnected by a number of point-to-point interfaces. The operations discussed with reference to FIGS. 1-4 may be performed by one or more components of the system 400.

As illustrated in FIG. 4, the system 400 may include several processors, of which only two, processors 402 and 404 are shown for clarity. The processors 402 and 404 may each include a local memory controller hub (MCH) 406 and 408 to enable communication with memories 410 and 412. The memories 410 and/or 412 may store various data such as those discussed with reference to the memory 114 of FIGS. 1 and/or 3. Also, MCH 406 and 408 may include the memory controller 120 in some embodiments. Furthermore, system 400 includes logic 125, and/or SSD 130 (which may be coupled to system 400 via bus 440/544, via other point-to-point connections to the processor(s) 402/504 or chipset 420, where logic 125 is incorporated into chipset 420, etc. in various embodiments).

In an embodiment, the processors 402 and 404 may be one of the processors 302 discussed with reference to FIG. 3. The processors 402 and 404 may exchange data via a point-to-point (PtP) interface 414 using PtP interface circuits 416 and 418, respectively. Also, the processors 402 and 404 may each exchange data with a chipset 420 via individual PtP interfaces 422 and 424 using point-to-point interface circuits 426, 428, 430, and 432. The chipset 420 may further exchange data with a high-performance graphics circuit 434 via a high-performance graphics interface 436, e.g., using a PtP interface circuit 437. As discussed with reference to FIG. 3, the graphics interface 436 may be coupled to a display device (e.g., display 317) in some embodiments.

In one embodiment, one or more of the cores 106 and/or processor cache 108 of FIG. 1 may be located within the processors 402 and 404 (not shown). Other embodiments, however, may exist in other circuits, logic units, or devices within the system 400 of FIG. 4. Furthermore, other embodiments may be distributed throughout several circuits, logic units, or devices illustrated in FIG. 4.

The chipset 420 may communicate with a bus 440 using a PtP interface circuit 441. The bus 440 may have one or more devices that communicate with it, such as a bus bridge 442 and I/O devices 443. Via a bus 444, the bus bridge 442 may communicate with other devices such as a keyboard/mouse 445, communication devices 446 (such as modems, network interface devices, or other communication devices that may communicate with the computer network 303, as discussed with reference to network interface device 330 for example, including via antenna 331), audio I/O device, and/or a data storage device 448. The data storage device 448 may store code 449 that may be executed by the processors 402 and/or 404.

Figure 5:
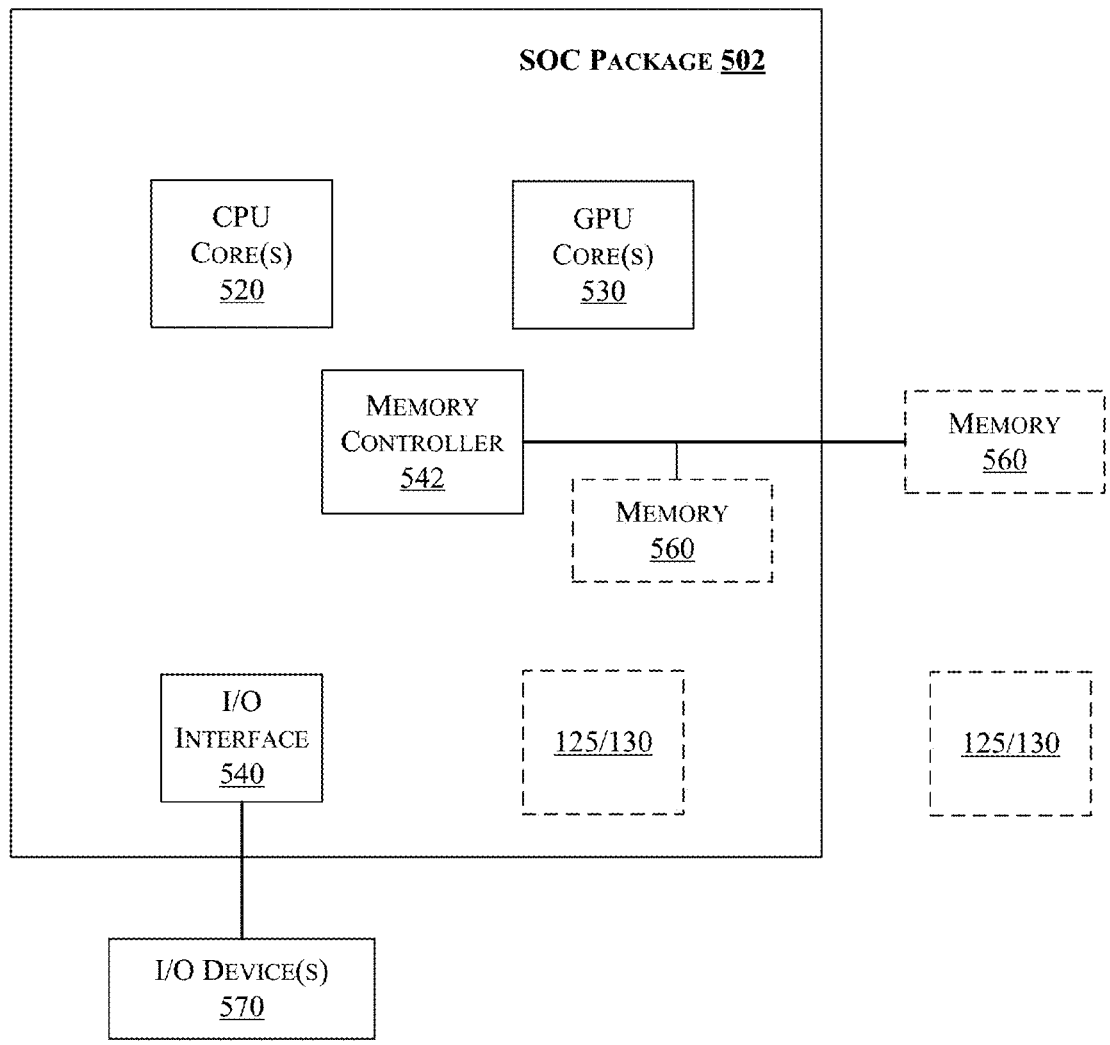

In some embodiments, one or more of the components discussed herein can be embodied as a System On Chip (SOC) device. FIG. 5 illustrates a block diagram of an SOC package in accordance with an embodiment. As illustrated in FIG. 5, SOC 502 includes one or more Central Processing Unit (CPU) cores 520, one or more Graphics Processor Unit (GPU) cores 530, an Input/Output (I/O) interface 540, and a memory controller 542 (which may be the same or similar to memory controllers 120/310/406/408 discussed with reference to the previous figures). Various components of the SOC package 502 may be coupled to an interconnect or bus such as discussed herein with reference to the other figures. Also, the SOC package 502 may include more or less components, such as those discussed herein with reference to the other figures. Further, each component of the SOC package 520 may include one or more other components, e.g., as discussed with reference to the other figures herein. In one embodiment, SOC package 502 (and its components) is provided on one or more Integrated Circuit (IC) die, e.g., which are packaged onto a single semiconductor device.

As illustrated in FIG. 5, SOC package 502 is coupled to a memory 560 (which may be similar to or the same as memory discussed herein with reference to the other figures such as memory 114/410/412) via the memory controller 542. In an embodiment, the memory 560 (or a portion of it) can be integrated on the SOC package 502.

The I/O interface 540 may be coupled to one or more I/O devices 570, e.g., via an interconnect and/or bus such as discussed herein with reference to other figures. I/O device(s) 570 may include one or more of a keyboard, a mouse, a touchpad, a display, an image/video capture device (such as a camera or camcorder/video recorder), a touch screen, a speaker, or the like. Furthermore, SOC package 502 may include/integrate 114/120 or other memory in an embodiment. Alternatively, items 114/120 or other memory may be provided outside of the SOC package 502 (i.e., as a discrete logic).

The following examples pertain to further embodiments. Example 1 includes an apparatus comprising: memory to store data, wherein the memory is to comprise a plurality of memory blocks, wherein an interface is to couple a processor and the plurality of memory blocks through N/2 channels and at least two memory ranks instead of through N channels and one memory rank. Example 2 includes the apparatus of example 1, wherein the interface through the N/2 channels and the at least two memory ranks is to couple the processor and the plurality of memory blocks through about half of a number of wires to be used for the N channels and the one memory rank. Example 3 includes the apparatus of example 1, wherein the processor is to transmit a no operation signal to a non-target rank and a valid command to a target rank. Example 4 includes the apparatus of example 1, wherein a clock signal is to be shared across the at least two ranks. Example 5 includes the apparatus of example 1, wherein a clock enable signal is to be shared across the at least two memory ranks. Example 6 includes the apparatus of example 1, wherein the data is to comprise one or more of: an input/output data bits, a data bus inversion bit, a data mask bit, a parity bit, or one or more redundant data bits. Example 7 includes the apparatus of example 1, wherein the memory is to support tri-state signaling for a read strobe signal, wherein the read strobe signal is to be shared across the at least two memory ranks. Example 8 includes the apparatus of example 1, wherein a write strobe signal is to be shared across the at least two memory ranks. Example 9 includes the apparatus of example 8, wherein the write strobe signal is to be selectively delayed for each of the at least two memory ranks. Example 10 includes the apparatus of example 1, wherein one or more error signals are to be shared across the at least two memory ranks. Example 11 includes the apparatus of example 10, wherein a trigger point of receiver logic of a memory controller, coupled to the memory, is to be adjusted for a lower supply voltage than a standard supply voltage. Example 12 includes the apparatus of example 1, wherein the memory is to comprise high bandwidth memory having a bandwidth of about 250 GB/s or more. Example 13 includes the apparatus of example 1, wherein the memory is to comprise dynamic random access memory. Example 14 includes the apparatus of example 1, wherein the plurality of memory blocks are to be accessed as an array, wherein the array is to comprise at least two rows and at least two columns. Example 15 includes the apparatus of example 1, further comprising one or more logic components to transmit or receive the data. Example 16 includes the apparatus of example 1, wherein the processor is to comprise one or more processor cores.

Example 17 includes a computing system comprising: a processor having one or more processor cores to execute one or more operations on data; and memory, coupled to the processor, to store the data, wherein the memory is to comprise a plurality of memory blocks, wherein an interface is to couple the processor and the plurality of memory blocks through N/2 channels and at least two memory ranks instead of through N channels and one memory rank. Example 18 includes the system of example 17, wherein the interface through the N/2 channels and the at least two memory ranks is to couple the processor and the plurality of memory blocks through about half of a number of wires to be used for the N channels and the one memory rank. Example 19 includes the system of example 17, wherein a clock signal is to be shared across the at least two memory ranks. Example 20 includes the system of example 17, wherein a clock enable signal is to be shared across the at least two memory ranks. Example 21 includes the system of example 17, wherein the data is to comprise one or more of: an input/output data bits, a data bus inversion bit, a data mask bit, a parity bit, or one or more redundant data bits. Example 22 includes the system of example 17, wherein the memory is to support tri-state signaling for a read strobe signal, wherein the read strobe signal is to be shared across the at least two memory ranks.

Example 23 includes a semiconductor package comprising: a processor having one or more processor cores; and memory to store the data, wherein the memory is to comprise a plurality of dynamic random access memory (DRAM) chips, wherein an interface is to couple the processor and the plurality of DRAM chips through N/2 channels and at least two memory ranks instead of through N Channels and one memory rank. Example 24 includes the package of example 23, wherein the interface through the N/2 channels and the at least two memory ranks is to couple the processor and the plurality of DRAM chips through about half of a number of wires to be used for the N channels and the one memory rank. Example 25 includes the package of example 23, wherein a clock signal or a clock enable signal are to be shared across the at least two memory ranks. Example 26 includes the package of example 23, wherein the processor is to transmit a no operation signal to a non-target rank and a valid command to a target rank. Example 27 includes the package of example 23, wherein the data is to comprise one or more of: an input/output data bits, a data bus inversion bit, a data mask bit, a parity bit, or one or more redundant data bits. Example 28 includes the package of example 23, wherein the memory is to support tri-state signaling for a read strobe signal, wherein the read strobe signal is to be shared across the at least two memory ranks. Example 29 includes the package of example 23, wherein a write strobe signal is to be shared across the at least two memory ranks. Example 30 includes the package of example 29, wherein the write strobe signal is to be selectively delayed for each of the at least two memory ranks. Example 31 includes the package of example 23, wherein one or more error signals are to be shared across the at least two memory ranks. Example 32 includes the package of example 23, wherein a trigger point of receiver logic of a memory controller, coupled to the memory, is to be adjusted for a lower supply voltage than a standard supply voltage. Example 33 includes the package of example 23, wherein the memory is to comprise high bandwidth memory having a bandwidth of about 250 GB/s or more. Example 34 includes the package of example 23, wherein the plurality of DRAM chips are to be accessed as an array, wherein the array is to comprise at least two rows and at least two columns. Example 35 includes the package of example 23, further comprising one or more logic components to transmit or receive the data. Example 36 includes the package of example 23, wherein the processor is to comprise one or more processor cores.

Example 37 includes an apparatus comprising means to perform a method as set forth in any preceding example. Example 38 includes machine-readable storage including machine-readable instructions, when executed, to implement a method or realize an apparatus as set forth in any preceding example.

In various embodiments, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features, numerical values, and/or methodological acts, it is to be understood that claimed subject matter may not be limited to the specific features, numerical values, or acts described. Rather, the specific features, numerical values, and acts are disclosed as sample forms of implementing the claimed subject matter.

The invention claimed is:

1. An apparatus comprising:
   memory to store data, wherein the memory is to comprise a plurality of memory blocks,
   wherein an interface is to couple a processor and the plurality of memory blocks through N/2 channels and at least two memory ranks instead of through N channels and one memory rank.

2. The apparatus of claim 1, wherein the interface through the N/2 channels and the at least two memory ranks is to couple the processor and the plurality of memory blocks through about half of a number of wires to be used for the N channels and the one memory rank.

3. The apparatus of claim 1, wherein the processor is to transmit a no operation signal to a non-target rank and a valid command to a target rank.

4. The apparatus of claim 1, wherein a clock signal is to be shared across the at least two ranks.

5. The apparatus of claim 1, wherein a clock enable signal is to be shared across the at least two memory ranks.

6. The apparatus of claim 1, wherein the data is to comprise one or more of: an input/output data bits, a data bus inversion bit, a data mask bit, a parity bit, or one or more redundant data bits.

7. The apparatus of claim 1, wherein the memory is to support tri-state signaling for a read strobe signal, wherein the read strobe signal is to be shared across the at least two memory ranks.

8. The apparatus of claim 1, wherein a write strobe signal is to be shared across the at least two memory ranks.

9. The apparatus of claim 8, wherein the write strobe signal is to be selectively delayed for each of the at least two memory ranks.

10. The apparatus of claim 1, wherein one or more error signals are to be shared across the at least two memory ranks.

11. The apparatus of claim 10, wherein a trigger point of receiver logic of a memory controller, coupled to the memory, is to be adjusted for a lower supply voltage than a standard supply voltage.

12. The apparatus of claim 1, wherein the memory is to comprise high bandwidth memory having a bandwidth of about 250 GB/s or more.

13. The apparatus of claim 1, wherein the memory is to comprise dynamic random access memory.

14. The apparatus of claim 1, wherein the plurality of memory blocks are to be accessed as an array, wherein the array is to comprise at least two rows and at least two columns.

15. The apparatus of claim 1, further comprising one or more logic components to transmit or receive the data.

16. The apparatus of claim 1, wherein the processor is to comprise one or more processor cores.

* * * * *